United States Patent
Fujiwara

(10) Patent No.: US 7,741,899 B2
(45) Date of Patent: Jun. 22, 2010

(54) STEP-UP POWER SUPPLY CIRCUIT AND STEPPING-UP METHOD

(75) Inventor: Hirofumi Fujiwara, Shiga (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 173 days.

(21) Appl. No.: 12/213,662

(22) Filed: Jun. 23, 2008

(65) Prior Publication Data
US 2009/0066408 A1 Mar. 12, 2009

(30) Foreign Application Priority Data
Jul. 4, 2007 (JP) .............................. 2007-176123

(51) Int. Cl.
G05F 1/10 (2006.01)
(52) U.S. Cl. ...................................... 327/536
(58) Field of Classification Search ......... 327/536–538, 327/390, 589; 363/59, 60
See application file for complete search history.

(56) References Cited

U.S. PATENT DOCUMENTS 7,135,911 B2 * 11/2006 Imamiya ..................... 327/536
7,265,606 B1 * 9/2007 Suzuki ....................... 327/536
7,403,062 B2 * 7/2008 Tain ........................... 327/536
7,505,290 B2 * 3/2009 Fujiwara ...................... 363/60

FOREIGN PATENT DOCUMENTS

JP 2005-20971 1/2005

* cited by examiner

*Primary Examiner*—Hai L Nguyen
(74) *Attorney, Agent, or Firm*—McGinn IP Law Group, PLLC

(57) ABSTRACT

Boosting operation of a charge pump is performed at a fixed period irrespective of the state of a load. A regulator for controlling a charge pump includes: a frequency dividing circuit generating a frequency-divided clock having a period that is twice that of a boost clock; a voltage dividing circuit generating a plurality of divided voltages having voltage values that differ from one another; a comparator circuit comparing each of the divided voltages and a reference voltage and outputting a plurality of comparison-result signals; a selection signal generating circuit reading in logic of each of the comparison-result signals in synch with an edge of the frequency-divided clock and outputting selection signals; a duty converting circuit outputting a plurality of clocks having different ON duties; a selector selecting any one of the plurality of clocks or "H"-level logic as a PWM signal based upon the selection signals; and a gate circuit taking the logical AND between the frequency-divided clock and the PWM signal and generating control signals for controlling series-parallel switching.

10 Claims, 7 Drawing Sheets

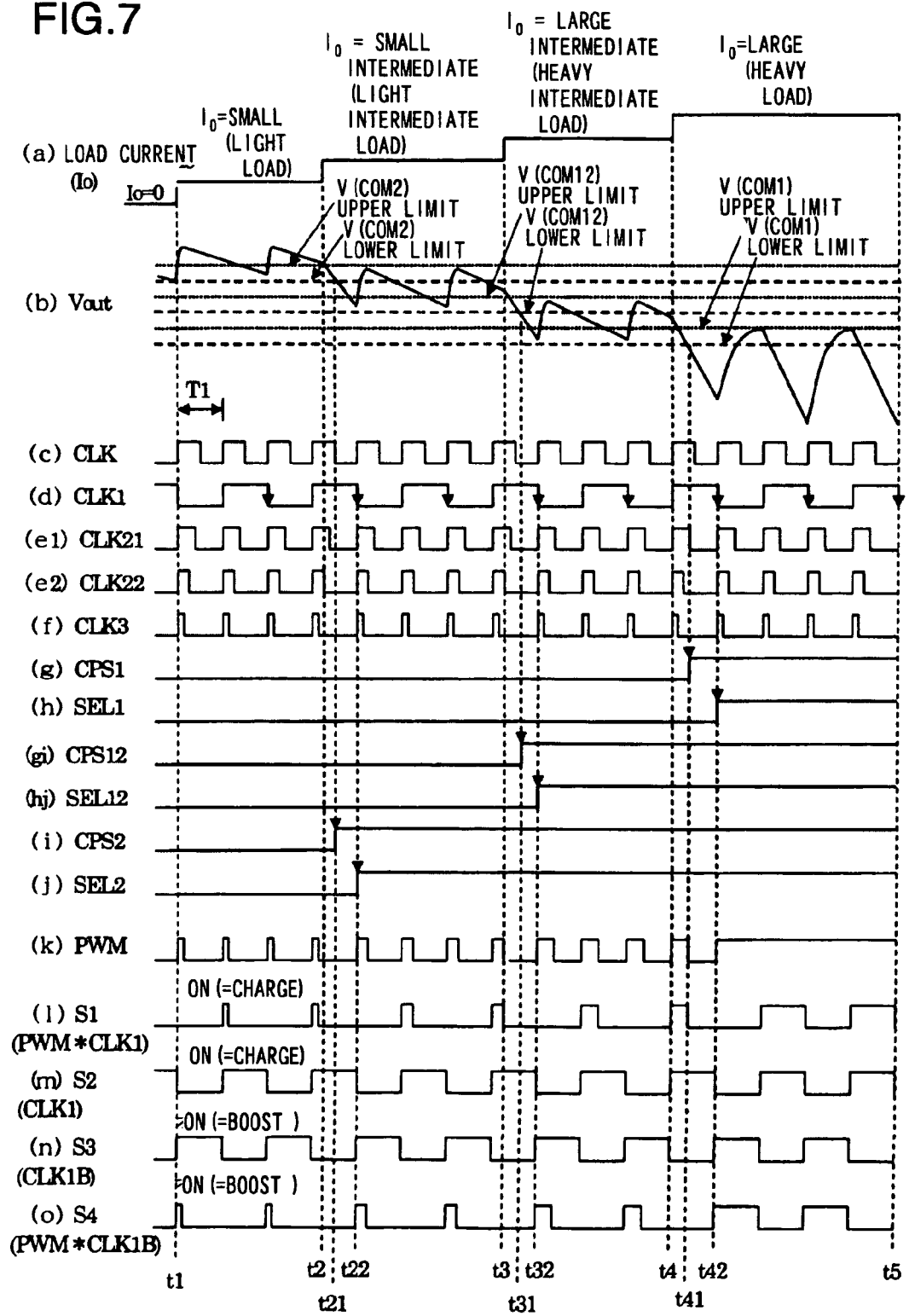

STEP-UP POWER SUPPLY CIRCUIT AND STEPPING-UP METHOD

REFERENCE TO RELATED APPLICATION

This application is based upon and claims the benefit of the priority of Japanese patent application No. 2007-176123, filed on Jul. 4, 2007, the disclosure of which is incorporated herein in its entirety by reference thereto.

TECHNICAL FIELD

This invention relates to a charge-pump-type step-up power supply circuit and method, more particularly, to a step-up power supply circuit having a function for controlling negative feedback of a charge-pump output to a target voltage, and a voltage stepping-up method.

BACKGROUND

A portable information device such as a mobile telephone or PDA (Personal Digital Assistant) usually has a display panel for displaying information and a circuit (a driver IC) for driving the display panel, which is formed by a semiconductor integrated circuit (IC). A portable information device uses a comparatively low-voltage battery as an external power supply, but the display panel usually requires a voltage higher than that of the supply voltage of the battery. For this reason, the driver IC generally incorporates a power supply circuit for generating the necessary driving voltage by boosting the supply voltage.

An example of such a power supply circuit is illustrated in Patent Document 1. Specifically, as shown in FIG. 1, a power supply circuit 1 of charge-pump type has a charge pump 10 and a regulator 20. With this arrangement, the pulses of a clock signal CLK1 that causes the charge pump 10 to perform a boosting operation are skipped by the regulator 20 in accordance with the output voltage of the charge pump 10, whereby a voltage (a target voltage) obtained by boosting supply voltage VDD up to a desired voltage value is output from the charge pump 10 as Vout. A detailed description of the structure and operation of the charge pump 10 and regulator 20 are set forth in Patent Document 1 and are omitted here.

[Patent Document 1]
Japanese Patent Kokai Publication No. JP-P2005-20971A (FIGS. 3, 4)

SUMMARY OF THE DISCLOSURE

The entire disclosure of Patent Document 1 is incorporated herein by reference thereto. The following analyses are given by the present invention.

The boosting operation of the power supply circuit 1 when under a light load is performed in response to a clock signal CLK2 that repeatedly takes on "L" and "H" levels at a frequency dependent upon the operating speed of the regulator 22 during the time that the clock signal CLK1 is at the "H" level. The boosting operation based upon the clock signal CLK2 is one of indeterminate frequency with respect to the clock signal CLK1 owing to the output level of Vout. In other words, since the load current of Vout is not constant, the slope of the voltage-drop curve of Vout also is not constant. Consequently, the ON and OFF cycles of switches SW1 to SW4 that construct the charge pump 10 also are not constant. Since a current for charging and discharging a boost capacitor C1 flows transiently into the switches SW1 to SW4, it is required that the switches SW1 to SW4 be made low-impedance switches. In the chip layout of the driver IC, therefore, the switches SW1 to SW4 are of very large size. Since switches SW1 to SW4 are large in size, the numbers of elements and wires adjacent to the switches SW1 to SW4 also are large. The indeterminate-frequency operation of these large switches SW1 to SW4 becomes a source of noise and there is the danger that this will induce a malfunction in the adjacent logic circuits, etc., within the driver IC. Thus there is much to be desired in the art.

According to an aspect of the present invention, there is provided a step-up power supply circuit. The power supply circuit comprises a charge pump that connects a capacitor to a DC supply voltage by series-parallel switching, thereby boosting the DC supply voltage by a voltage to which the capacitor is charged, and a regulator that controls negative feedback of output voltage of the charge pump to a target voltage. The regulator detects (for example, in the form of binary signals), whether the output voltage of the charge pump is equal to or greater than each of a plurality of detection voltages or less than each of the plurality of detection voltages, and subjects the series-parallel switching to PWM control based upon a combination of the detected signals (for example, in the form of binary values).

In another aspect of the present invention there is provided a method for stepping-up voltage. The method comprises:

providing a voltage step-up circuit including a charge pump that connects a capacitor to a DC supply voltage by series-parallel switching, thereby boosting the DC supply voltage by a voltage to which the capacitor is charged; and a regulator that controls negative feedback of output voltage of the charge pump to a target voltage.

By the regulator, signals are detected, which are indicative of whether the output voltage of the charge pump is equal to or greater than each of a plurality of detection voltages or less than each of the plurality of detection voltages.

The resultant signals are subjected to series-parallel switching to PWM control based upon a combination of the detected signals.

The meritorious effects of the present invention are summarized as follows.

In accordance with the present invention, a control signal for controlling switches of a charge pump always has a frequency identical with that of a frequency-divided clock. Even when the load is light, therefore, all of the switches continue to be operated at a determined frequency and high-frequency operation of an indeterminate frequency is avoided. This makes it possible to prevent the occurrence of noise. As a result, the occurrence of malfunction due to noise can be prevented in adjacent logic circuits, etc., within the semiconductor integrated circuit that constructs the power supply circuit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 7 is a signal waveform diagram illustrating the operation of the power supply circuit shown in FIG. 5.

PREFERRED MODES OF THE INVENTION

Relating to the step-up power circuit or voltage stepping-up method, the detection of the output voltage of the charge pump may be performed by comparing a divided voltage, which is obtained by voltage-dividing the output voltage, with a reference voltage. The comparison of the divided voltage with the reference voltage may be performed between a plurality of different voltages and a single voltage constituting the other of the compared values.

The regulator may include: a frequency dividing circuit that generates a frequency-divided clock having a period that is twice that of a boost clock;

a voltage dividing circuit that generates the divided voltage;

a comparator circuit that compares the divided voltage and the reference voltage and outputs a plurality of comparison-result signals; and a selection signal generating circuit that reads in logic of each of the comparison-result signals in synch with an edge of the frequency-divided clock and outputs the binary signals as selection signals. The regulator may further include: a duty converting circuit that outputs a plurality of clocks having the same period as that of the boost clock and ON duties that differ from the ON duty of the boost clock;

a selector that selects any one of the plurality of clocks or "H"-level logic as a PWM signal based upon the selection signals; and a gate circuit that takes the logical AND between the frequency-divided clock and the PWM signal and generating control signals for controlling the series-parallel switching.

The plurality of different divided voltages may be generated by the voltage dividing circuit and are adopted as the plurality of different voltages; and the comparator circuit may compare the plurality of different divided voltages with a single reference voltage.

Figure 1:
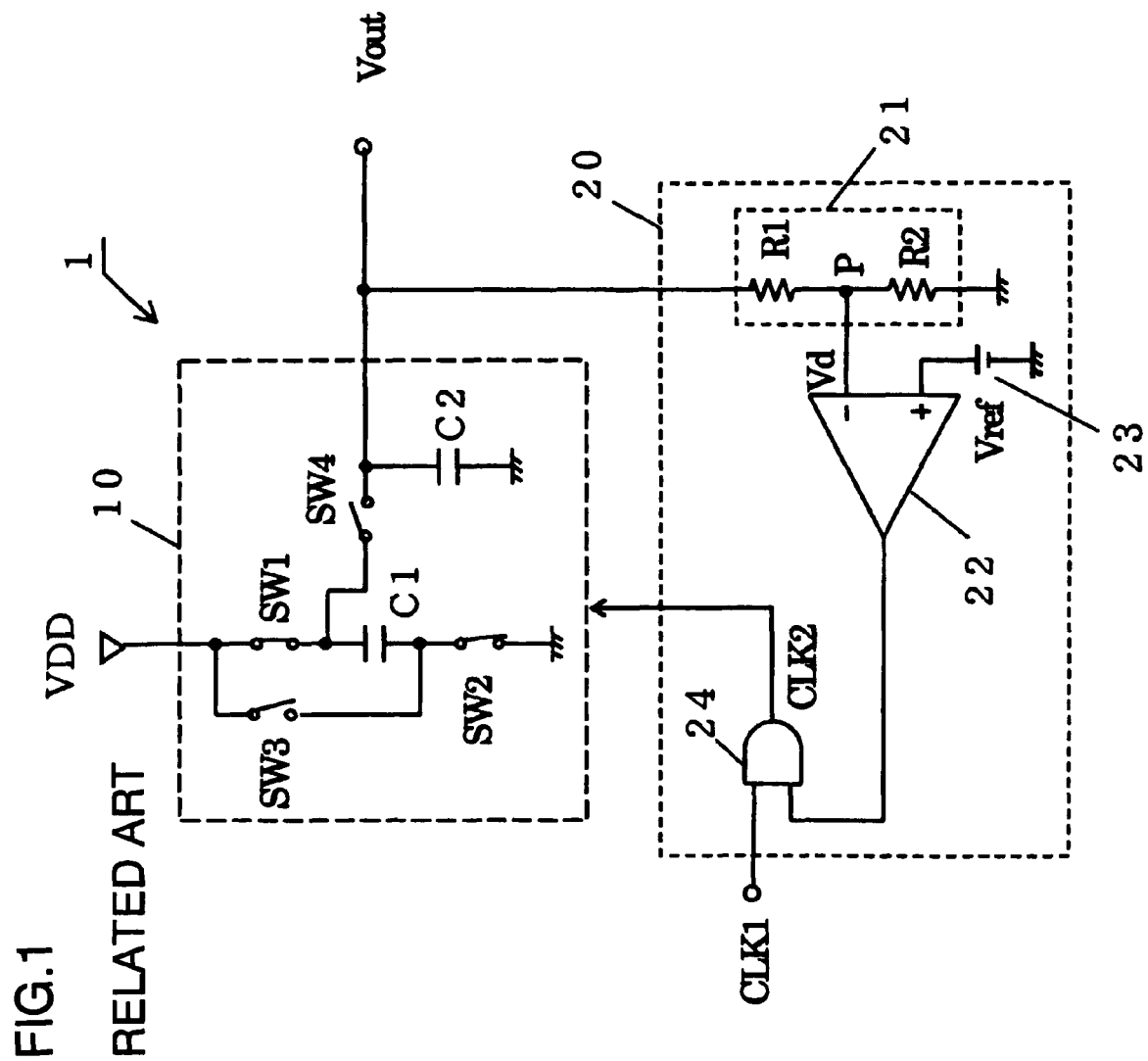
FIG. 1 is a circuit diagram of one example of a power supply circuit of charge-pump-type according to the related art.
Figure 2:
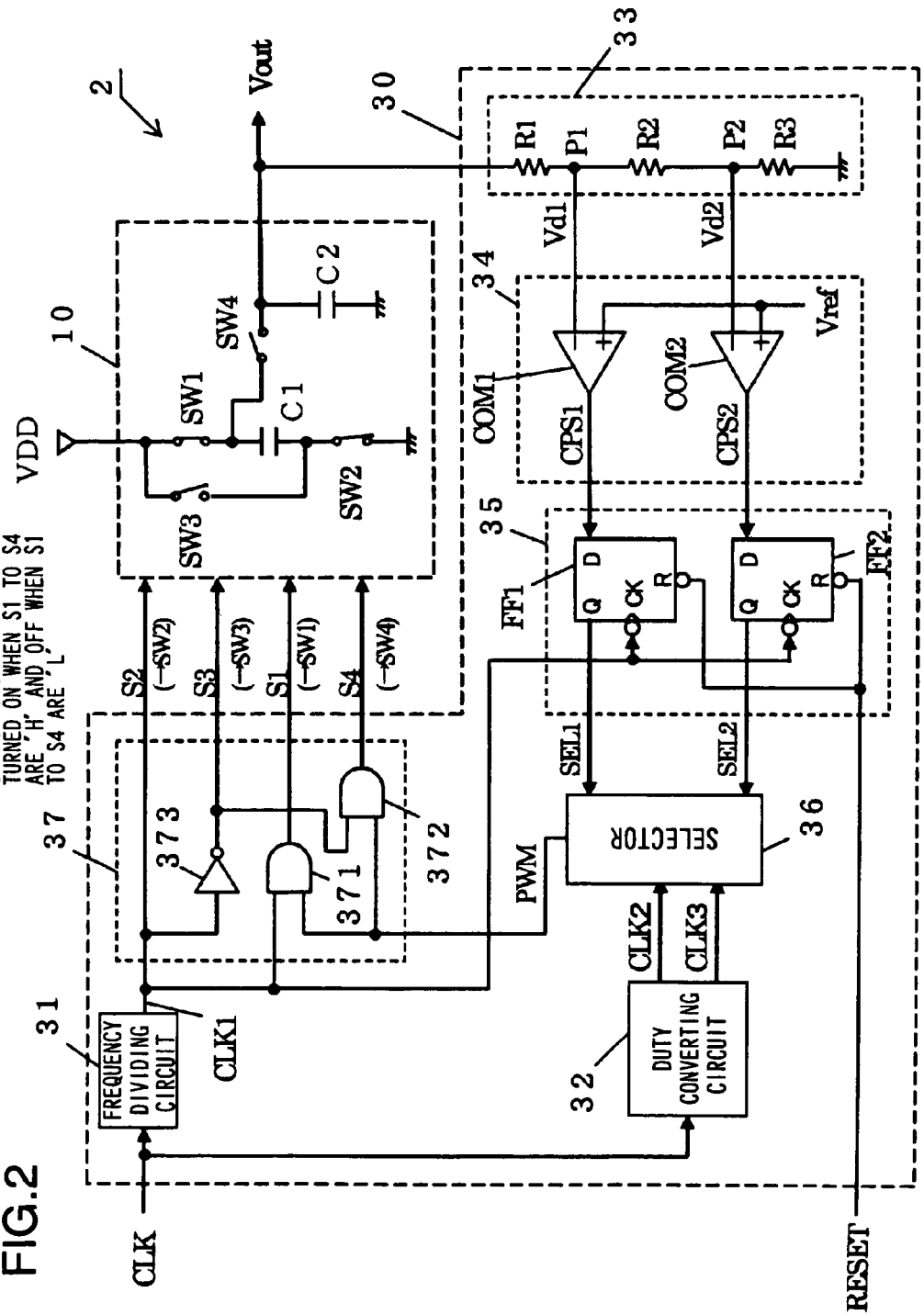
FIG. 2 is a circuit diagram of a power supply circuit according to a first exemplary embodiment of the present invention.

Exemplary embodiments of the present invention will be described in detail with reference to the drawings, in which FIG. 2 is a circuit diagram illustrating a power supply circuit 2 according to a first exemplary embodiment of the present invention. The power supply circuit 2, which has a charge pump 10 and a regulator 30, boosts supply voltage VDD up to a desired boosted voltage (target voltage) and supplies the voltage to a load circuit (not shown) as an output voltage Vout.

The charge pump 10 has switches SW1 to SW4, a boost capacitor C1 and a smoothing capacitor C2. The switches SW1 to SW4 are controlled by control signals S1 to S4, respectively, from the regulator 30. The supply voltage VDD is applied to and charges the boost capacitor C1 via the switches SW1 and SW2. The supply voltage VDD is supplied to the low-potential side of the charged boost capacitor C1 by the switch SW3, whereby the supply voltage VDD is boosted by the voltage to which the boost capacitor C1 has been charged. The boosted voltage is applied to the smoothing capacitor C2 by the switch SW4, whereby the boosted voltage is smoothened and then supplied to the load circuit as output voltage Vout. It should be noted that although the power supply circuit 2 is constructed together with other function blocks within the semiconductor integrated circuit (i.e., IC chip), the boost capacitor C1 and smoothing capacitor C2 are connected as external components.

The regulator 30, which includes a frequency dividing circuit 31, a duty converting circuit 32, a voltage dividing circuit 33, a comparator circuit 34, a selection signal generating circuit 35, a selector 36 and a gate circuit 37, controls the charge pump 10 by negative feedback of the output voltage Vout, thereby regulating the output voltage Vout to the target voltage.

The frequency dividing circuit 31 frequency-divides a boost clock CLK (on duty: 50%) from an oscillator (not shown) to a clock (divided clock) CLK1 having twice the period, and outputs the clock CLK1 to the selection signal generating circuit 35 and gate circuit 37.

The duty converting circuit 32 generates clocks CLK2, CLK3 having the same period as but different duties from the boost clock CLK and outputs these clocks to the selector 36. The ON duties of the clocks CLK2, CLK3 are set in such a manner that CLK2>CLK3 holds in terms of ON duty. Although this will be described later, the clock CLK3 is used in switch control of the charge pump 10 at the time of a light load near no load, and the ON duty of the clock CLK3 is set in such a manner that switch control is possible at a minimum pulse width (minimum ON duty) that is capable of regulating output voltage Vout to the target voltage. Further, the clock CLK2 is used in switch control of the charge pump 10 at the time of an intermediate load, and the ON duty of the clock CLK2 is set in such a manner that switch control is possible at a prescribed ON duty smaller than an ON duty of 50% and greater than the minimum ON duty.

The voltage dividing circuit 33 divides the output voltage Vout from the charge pump 10 by resistors R1, R2, R3 and outputs divided voltages Vd1, Vd2 to the comparator circuit 34 from voltage-dividing points P1, P2, respectively.

The comparator circuit 34, which includes comparators COM1, COM2 having a hysteresis characteristic, compares the divided voltages Vd1, Vd2 with a reference voltage Vref and outputs comparison results CPS1, CPS2 to the selection signal generating circuit 35. The comparator COM1 has an inverting input terminal to which the divided voltage Vd1 is applied, and a non-inverting input terminal to which the reference voltage Vref is applied. The comparator COM2 has an inverting input terminal to which the divided voltage Vd2 is applied, and a non-inverting input terminal to which the reference voltage Vref is applied. The comparators COM1, COM2 output comparison results CPS1, CPS2, namely logic signals that take on the "H" level when the divided voltages Vd1, Vd2 are lower than the reference voltage Vref and take on the "L" level when the divided voltages Vd1, Vd2 are higher than the reference voltage Vref. The divided voltages Vd1, Vd2 are represented by the following equations:

$$Vd1 = Vout \times (R2+R3)/(R1+R2+R3)$$

$$Vd2 = Vout \times R3/(R1+R2+R3)$$

Detection voltages V(COM1), V(COM2) detected by the comparators COM1, COM2 when the output voltage Vout rises are represented by the following equations:

$$V(COM1) = Vref \times [1 + R1/(R2+R3)]$$

$$V(COM2) = Vref \times [1 + (R1+R2)/R3]$$

Here the detection voltage V(COM2) is set as the boost target voltage of output voltage Vout. For example, in a case where it is assumed that the target voltage is 5.5V, it will suffice to set R1+R2=R3 if Vref =2.75V holds. Further, if R1=R2 is set at this time, then detection voltage V(COM1)=3.67V holds. That is, we have V(COM2)=target voltage=5.5V>detection voltage V(COM1)=3.67V.

The selection signal generating circuit 35, which has D-type flip-flops FF1, FF2, outputs selection signals SEL1, SEL2 to the selector 36 based upon the comparison results CPS1, CPS2. The comparison results CPS1, CPS2 are input to the data terminals D of the flip-flops FF1, FF2, respectively, the clock CLK1 is input to clock terminals CK thereof and a reset signal RESET is input to the reset terminals R thereof, and the flip-flops FF1, FF2 output the selection signals SEL1, SEL2, respectively, from output terminals Q thereof. When the logic of the reset signal RESET is at the "L" level, the flip-flops FF1, FF2 are reset and the logic at the output terminal Q falls to the "L" level. Further, when the logic of the reset signal RESET is at the "H" level, the flip-flops FF1, FF2 read in the logic at the respective data terminals D, i.e., the logic of the comparison results CPS1, CPS2, in synch with the falling edge of the clock CLK1, and the logic at the respective output terminals Q becomes the logic levels that have been read in.

Figure 3:
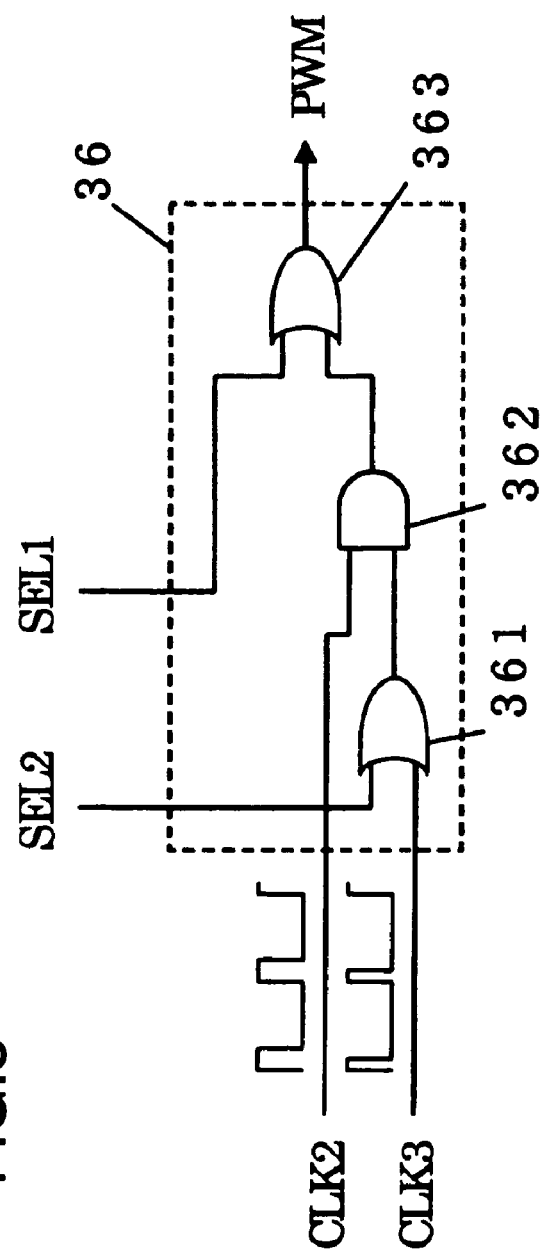
FIG. 3 is a circuit diagram of a selector used in the power supply circuit shown in FIG. 2.

As illustrated in FIG. 3, the selector 36 has OR gates 361, 363 and an AND gate 362, selects one among the "H"-level logic and clocks CLK2, CLK3 based upon the selection signals SEL1, SEL2, and outputs the selected signal to the gate circuit 37 as a PWM signal. The selection signal SEL2 and the clock CLK3 are input to the two-input OR gate 361, which takes the logical OR between these two signals. The output of the OR gate 361 and the clock CLK2 are input to the AND gate 362, which takes the logical AND between these two signals. The output of the AND gate 362 and the selection signal SEL1 are input to the OR gate 363, which takes the logical OR between these two signals. The output of the OR gate 363 is input to the gate circuit 37.

The "H"-level logic is output when (SEL1, SEL2)=(H, H) holds;

the clock CLK2 is output when (SEL1, SEL2)=(L, H) holds; and the clock CLK3 is output when (SEL1, SEL2)=(L, L) holds, as shown in FIG. 3.

The gate circuit 37, which has AND gates 371, 372 and a NOT gate (inverter) 373, logically processes the clock CLK1 and PWM signal and outputs control signals S1 to S4 to the charge pump 10. The AND gate 371 takes the logical AND between the clock signal CLK1 and the PWM signal and outputs the result as the control signal S1. The AND gate 372 takes the logical AND between the clock signal CLK1 via the NOT gate 373 and the PWM signal and outputs the result as the control signal S4. Further, the clock signal CLK1 is output as is as the control signal S2 and is output as the control signal S3 via the NOT gate 373.

The operation of the power supply circuit 2 having the structure set forth above will be described with reference to FIG. 4. In the operating state of the power supply circuit 2 (from time t1 to t4), the power supply circuit 2 is being supplied with the supply voltage VDD, reference voltage Vref and reset signal RESET (these voltages and signal are not shown). The boost clock CLK is being supplied at a period T1, as illustrated at (c) in FIG. 4, and the output voltage Vout is being supplied from the power supply circuit 2 to the load circuit, as indicated at (b) in FIG. 4.

The output voltage Vout is divided by the voltage dividing circuit 33, and the divided voltages Vd1, Vd2 are output to the comparator circuit 34 from the voltage dividing circuit 33.

The comparator circuit 34 compares the divided voltages Vd1, Vd2 with the reference voltage Vref using the comparators COM1, COM2, respectively, and outputs the comparison results CPS1, CPS2, which conform to the value of the output voltage Vout (described later), as indicated at (g), (i) in FIG. 4. Owing to the hysteresis characteristic of the comparators COM1, COM2, the detection voltages V(COM1), V(COM2) detected by the comparators COM1, COM2, respectively, have a hysteresis width defined by an upper limit indicated by a dot line and a lower limit indicated by a dashed (broken) line, as illustrated at (b) in FIG. 4. Consequently, the detection voltages V(COM1), V(COM2) are detected at upper limits indicated by the dot lines when the output voltage Vout rises and at lower limits indicated by the dashed (broken) lines when the output voltage Vout falls.

Figure 4:
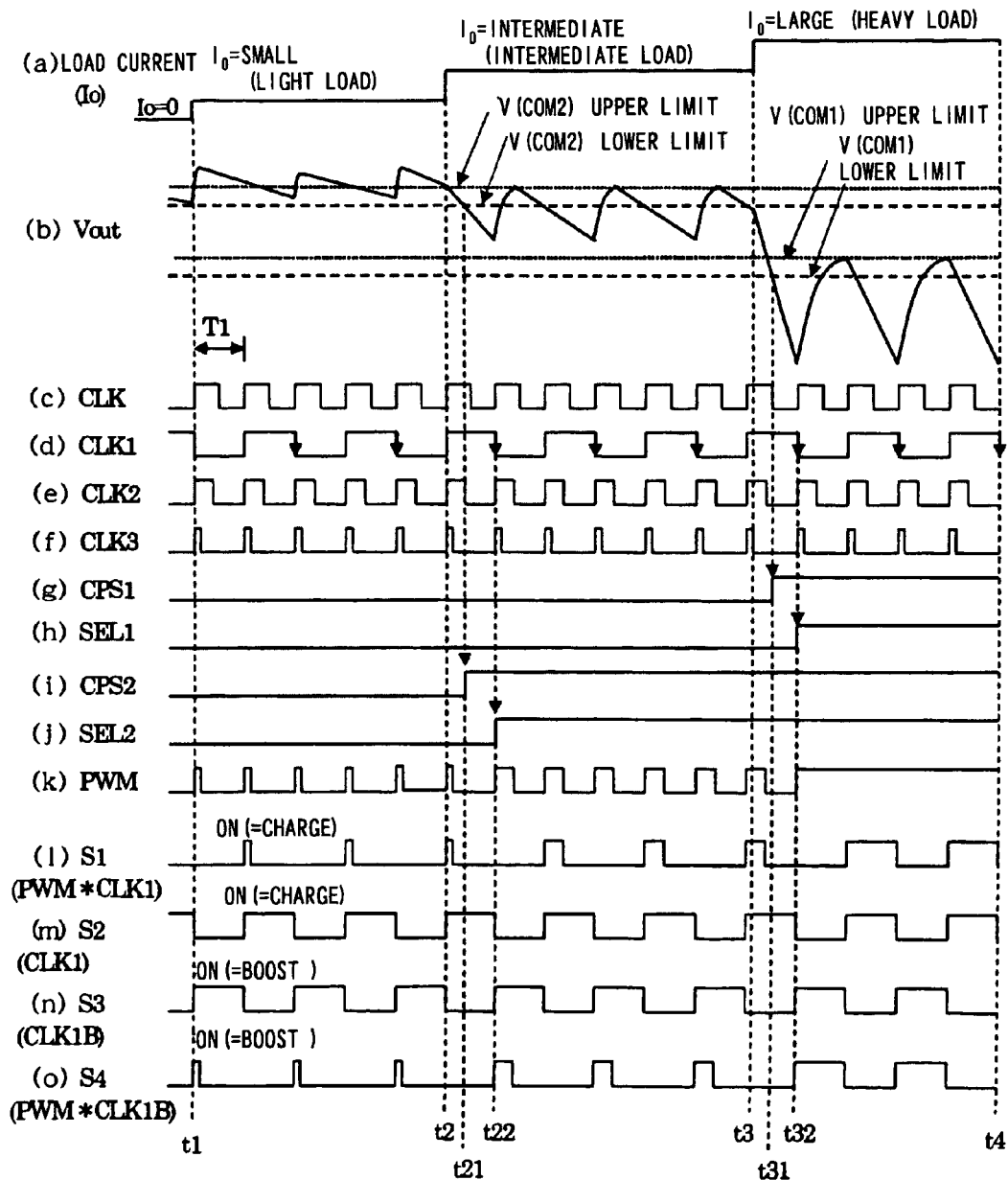
FIG. 4 is a signal waveform diagram illustrating the operation of the power supply circuit shown in FIG. 1.

The boost clock CLK is input to and frequency-divided by the frequency dividing circuit 31 and is output from the frequency dividing circuit 31 as clock CLK1 having a period 2T1, as indicated at (d) in FIG. 4. Further, the boost clock CLK is input to the duty converting (charging) circuit 32, subjected to a duty conversion (charge) and output from the duty converting circuit 32 as clocks CLK2, CLK3, as indicated at (e), (f) in FIG. 4.

The clock CLK1 from the frequency dividing circuit 31 is input to the gate circuit 37. The gate circuit 37 outputs this clock as is as the control signal S2, as indicated at (m) in FIG. 4, and outputs a clock CLK1B, as the control signal S3, which is obtained by inverting the clock CLK1 via the NOT gate 373, as indicated at (n) in FIG. 4. Further, the clock CLK1 is input to the AND gate 371 and, via the NOT gate 373, to the AND gate 372 together with the PWM signal that conforms to the value of the output voltage Vout, described later. The AND gate 372 takes the logical AND between these two inputs. The outputs of the AND gates 371, 372 are output as the control signals S1, S4, respectively, as indicated at (l), (o) in FIG. 4.

Further, the clock signal CLK1 from the frequency dividing circuit 31 is input also to the selection signal generating circuit 35. The clock CLK1 is input to the clock terminal CK of each of the D-type flip-flops FF1, FF2 in the selection signal generating circuit 35. In synch with the falling edge of the clock CLK1, the D-type flip-flops FF1, FF2 read in the logic at the respective data terminals D, i.e., the logic of the comparison results CPS1, CPS2 that conform to the value of the output voltage Vout, described later, and the logic at the respective output terminals Q becomes these read-in levels. The logic at the output terminals Q is output as the selection signals SEL1, SEL2, as indicated at (h), (j) in FIG. 4. It should be noted that the D-type flip-flops FF1, FF2 are reset by the "L" logic of the reset signal RESET at the start of operation of the power supply circuit 2 prior to time t1, and from that time onward are fixed at the "H" level, although this is not illustrated.

The clocks CLK2, CLK3 from the duty converting circuit 32 are input to the selector 36. On the basis of the selection signals SEL1, SEL2 conforming to the value of the output voltage Vout, described later, the selector 36 selects either of the clocks CLK2, CLK3 or the "H"-level logic and outputs the selected signal as the PWM signal, as indicated at (k) in FIG. 4.

The control signals S1 to S4 from the gate circuit 37 are input to the charge pump 10. The switches SW1, SW2, SW3 and SW4 in the charge pump 10 are turned on by "H"-level logic of the control signals S1, S2, S3 and S4, respectively. When the switches SW1, SW2 are on and the switches SW3, SW4 are off, the boost capacitor C1 is charged by the supply voltage VDD. When the switches SW1, SW2 are off and the switches SW3, SW4 are on, the supply voltage VDD is boosted by the voltage to which the boost capacitor C1 has been charged, the boosted voltage is smoothened by the smoothing capacitor C2 and the smoothed voltage is output from the charge pump 10.

With regard to the operation through which the control signals S1, S4 conforming to the output voltage Vout are generated, this operation will be described for each of the load levels of the load circuit, namely the levels of a load current $I_O$. This will be described taking as an example a case where the load level transitions from a light load to an intermediate load and then to a heavy load, as indicated at (a) in FIG. 4.

(1) Light-load State: Load Current $I_O$ is Small (Time Period from t1 to t2)

In the time period from time t1 to time t2, the output voltage Vout is equal to or greater than the lower limit of the detection voltage V(COM2) of comparator COM2 (i.e., Vref≦Vd2), and the comparison results CPS1, CPS2 are at the "L" logic level, as indicated at (g), (i) in FIG. 4. Accordingly, the selection signals SEL1, SEL2 remain at the "L" level, as indicated at (h), (j) in FIG. 4. As a result, the clock CLK3 is selected as the PWM signal, as indicated at (k) in FIG. 4. This means that the control signal S1 is the result of taking the logical AND between the clock CLK3 and the clock CLK1, as indicated at (l) of FIG. 4, and therefore becomes a signal that rises at the same time as the clock CLK1, has the same period as the clock CLK1 and has half the ON duty of the clock CLK3. Further, the control signal S4 is the result of taking the logical AND between the clock CLK3 and the clock CLK1B, as indicated at (o) of FIG. 4, and therefore becomes a signal that rises at the same time as the clock CLK1B, has the same period as the clock CLK1B and has half the ON duty of the clock CLK3.

(2) Intermediate-load state: Load Current $I_O$ is Intermediate (Time Period from t2 to t3)

When time t21 arrives, the output voltage Vout becomes greater than the lower limit of the detection voltage V(COM1) of comparator COM1 (i.e., Vref≦Vd1) and lower than the lower limit of the detection voltage V(COM2) of comparator COM2 (i.e., Vref>Vd2), as indicated at (b) of FIG. 4. At this time the comparison result CPS2 takes on the "H" logic level, as indicated at (i) of FIG. 4. The comparison result CPS1 remains at the "L" level, as indicated at (g) of FIG. 4. In the time period from time t21 to time t3, the output voltage Vout is greater than the lower limit of the detection voltage V(COM1) of comparator COM1 (i.e., Vref≦Vd1) and is lower than the upper limit of the detection voltage V(COM2) of comparator COM2 (i.e., Vref>Vd2). At this time the comparison result CPS1 remains at the "L" level, as indicated at (g) of FIG. 4. The comparison result CPS2 remains at the "H" level, as indicated at (i) of FIG. 4. Accordingly, the selection signal SEL2 attains the "H" logic level in synch with the falling edge of the clock CLK1 at time t22 and remains at the "H" level from time t22 to time t3, as indicated at (j) in FIG. 4. The selection signal SEL1 remains at the "L" level from time t22 to time t3, as indicated at (h) in FIG. 4. As a result, the clock CLK2 is selected as the PWM signal from time t22 to time t3, as indicated at (k) in FIG. 4. This means that the control signal S1 is the result of taking the logical AND between the clock CLK2 and the clock CLK1, as indicated at (l) of FIG. 4, and therefore becomes a signal that rises at the same time as the clock CLK1, has the same period as the clock CLK1 and has half the ON duty of the clock CLK2. Further, the control signal S4 is the result of taking the logical AND between the clock CLK2 and the clock CLK1B, as indicated at (o) of FIG. 4, and therefore becomes a signal that rises at the same time as the clock CLK1B, has the same period as the clock CLK1B and has half the ON duty of the clock CLK2.

(3) Heavy-load State: Load Current $I_O$ is Large (Time Period from t3 to t4)

When time t31 arrives, the output voltage Vout becomes lower than the lower limit of the detection voltage V(COM1) of comparator COM1 (i.e., Vref>Vd1). At this time the comparison result CPS1 takes on the "H" logic level, as indicated at (g) of FIG. 4. The comparison result CPS2 remains at the "H" level, as indicated at (i) of FIG. 4. In the time period from times t31 to t4, the output voltage Vout is lower than the upper limit of the detection voltage V(COM1) of comparator COM1 (i.e., Vref>Vd1). At this time the comparison results CPS1, CPS2 remain at the "H" level, as indicated at (g), (i) of FIG. 4. Accordingly, the selection signal SEL1 attains the "H" logic level in synch with the falling edge of the clock CLK1 at time t32 and remains at the "H" level from time t32 to time t4, as indicated at (h) in FIG. 4. The selection signal SEL2 remains at the "H" level from time t32 to time t4, as indicated at (j) in FIG. 4. As a result, the "H" logic level is selected as the PWM signal from time t32 to time t4, as indicated at (k) in FIG. 4. This means that the clock CLK1 becomes the control signal S1, as indicated at (l) of FIG. 4. Further, the clock CLK1B becomes the control signal S4, as indicated at (o) of FIG. 4.

As described above, the power supply circuit 2 is subjected to PWM control through control of the switches of the charge pump 10 at three types of ON duty in accordance with the state of the load, namely at an ON duty of 50% at the time of a heavy load at a period that is twice that of the boost clock; a minimum ON duty at the time of a load near no load; and at a prescribed ON duty less than 50% and greater than the minimum ON duty at the time of an intermediate load. As a result, switch control by a high frequency that is indeterminate is not performed and there is no danger that noise will occur.

Figure 5:
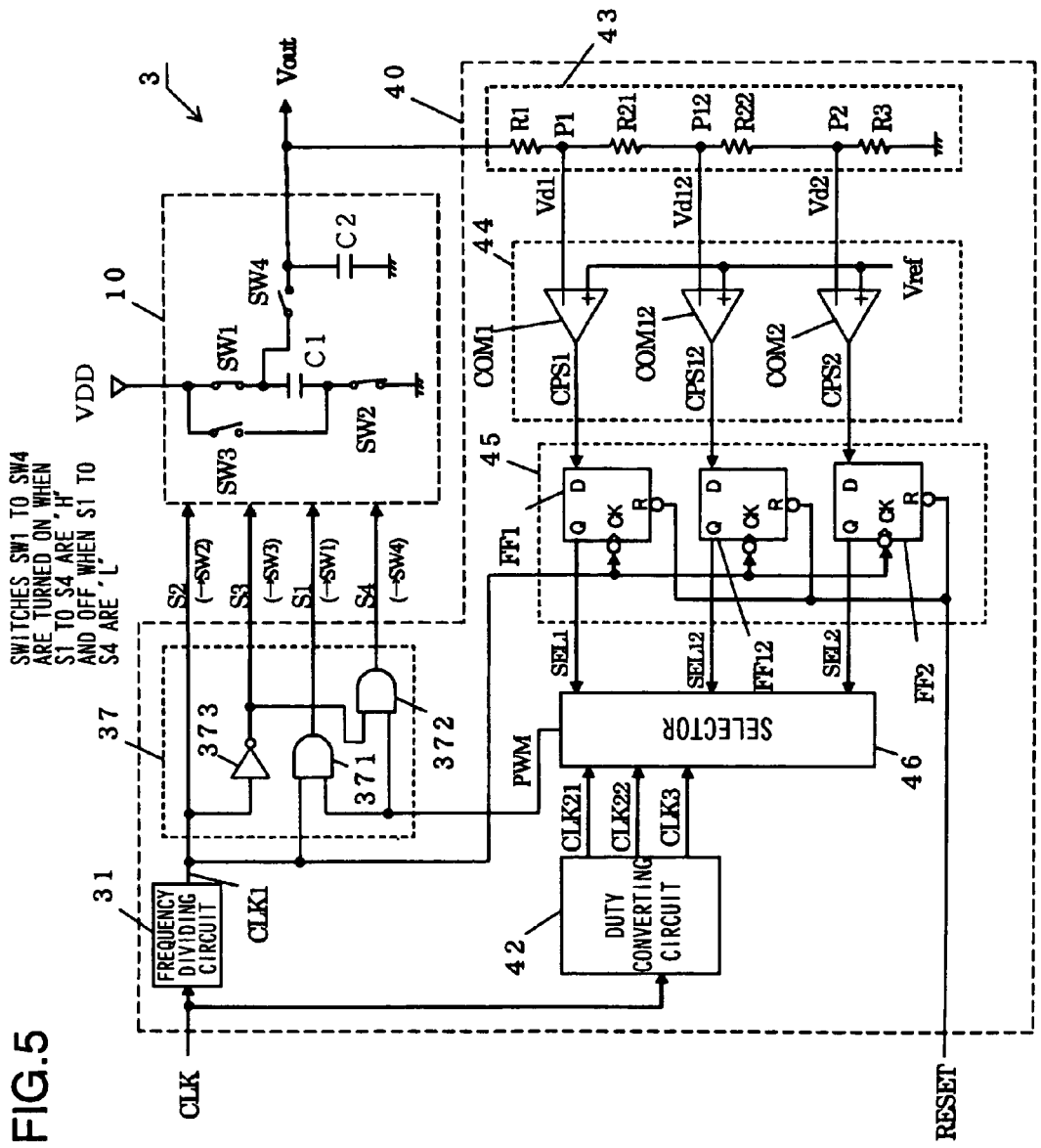
FIG. 5 is a circuit diagram of a power supply circuit according to a second exemplary embodiment of the present invention.

FIG. 5 is a circuit diagram illustrating a power supply circuit 3 according to a second exemplary embodiment of the present invention. Structural elements identical with those in FIG. 2 are designated by like reference characters and need not be described again. The power supply circuit 3 is obtained by replacing the regulator 30 of the power supply circuit 2 in FIG. 2 with a regulator 40. With the regulator 40, the output voltage Vout is capable of being detected between the detection voltage of the comparator COM1 and the detection voltage of the comparator COM2 by providing one additional comparator, and PWM control between the detection voltage of the comparator COM1 and the detection voltage of the comparator COM2 can be carried at two types of ON duty.

The regulator 40 includes a duty converting circuit 42, a voltage dividing circuit 43, a comparator circuit 44, a selection signal generating circuit 45 and a selector 46 in place of the frequency dividing circuit 31, duty converting circuit 32, voltage dividing circuit 33, comparator circuit 34, selection signal generating circuit 35 and selector 36 in the regulator of FIG. 2.

In the duty converting circuit 42, the output of the clock CLK2 of the duty converting circuit 32 in FIG. 2 is replaced by clocks CLK21, CLK22 having the same period as, but different duties from, the boost clock CLK. The ON duties of the clocks CLK21, CLK22 are set in such a manner that CLK21>CLK22 holds in terms of ON duty. Although this will be described later, the clocks CLK21, CLK22 are used in switch control of the charge pump 10 at the time of an intermediate load, in a manner similar to the clock CLK2, and the ON duties of the clocks CLK21, CLK22 are set in such a manner that switch control is possible at a prescribed ON duty smaller than an ON duty of 50% and greater than the minimum ON duty. voltage.

In the voltage dividing circuit 43, the resistor R2 in the voltage dividing circuit 33 of FIG. 2 is split into resistors R21, R22, and it is so arranged that a divided voltage Vd12 is output from a voltage-dividing point P12 of the resistors R21, R22.

The comparator circuit 44 is obtained by providing the comparator circuit 34 of FIG. 2 with an additional comparator COM12 having a hysteresis characteristic, and is so adapted that the divided voltage Vd12 at the voltage-dividing point P12 is compared with the reference voltage Vref. A result CPS12 of this comparison is output to the selection signal generating circuit 45. The comparator COM12 has an inverting input terminal to which the divided voltage Vd12 is applied, and a non-inverting input terminal to which the reference voltage Vref is applied. The comparator COM12 outputs the comparison result CPS12, namely a logic signal that takes on the "H" level when the divided voltage Vd12 is lower than the reference voltage Vref and takes on the "L" level when the divided voltage Vd12 is higher than the reference voltage Vref. The divided voltage Vd12 is represented by the following equation:

$$Vd12 = Vout \times (R22+R3)/(R1+R21+R22+R3)$$

A detection voltage V(COM12) detected by the comparator COM12 when the output voltage Vout rises is represented by the following equation:

$$V(COM12) = Vref \times [1+(R1+R21)/(R22+R3)]$$

If R21=R22, for example, is set, then detection voltage V(COM12)=4.4V holds. That is, we have V(COM2)=target voltage=5.5V>V(COM12)=4.4V>V(COM1)=3.67V.

The selection signal generating circuit 45 is obtained by providing the selection signal generating circuit 35 of FIG. 2 with an additional D-type flip-flop FF12 and outputs a selection signal SEL12 to the selector 46 based upon the comparison result CPS12. The comparison result CPS12 is input to the data terminal D of the flip-flops FF12, the clock CLK1 is input to clock terminal CK thereof and the reset signal RESET is input to the reset terminal R thereof, and the flip-flop FF12 outputs the selection signals SEL12 from the output terminal Q thereof. The D-type flip-flop FF12 operates in the same manner as the D-type flip-flops FF1, FF2.

Figure 6:
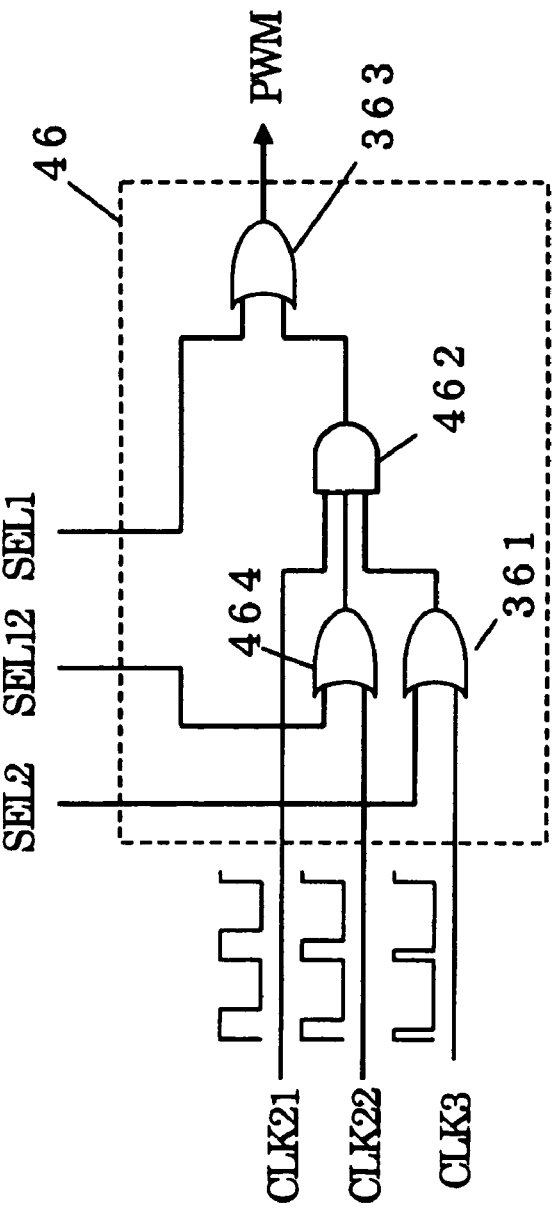
FIG. 6 is a circuit diagram of a selector used in the power supply circuit shown in FIG. 5.

As illustrated in FIG. 6, the selector 46 is obtained by replacing the AND gate 363 of the selection signal generating circuit 35 in FIG. 2 with a three-input AND gate 462 and providing an additional OR gate 464. The selector 36 selects one among the "H"-level logic and clocks CLK21, CLK22, CLK3 based upon the selection signals SEL1, SEL12, SEL2, and outputs the selected signal to the gate circuit 37 as the PWM signal. The selection signal SEL12 and the clock CLK22 are input to the OR gate 464, which takes the logical OR between these two signals. The outputs of the OR gates 361, 464 and the clock CLK21 are input to the AND gate 462, which takes the logical AND among these three signals. The output of the AND gate 462 and the selection signal SEL1 are input to the OR gate 363, which takes the logical OR between these two signals.

The "H"-level logic is output when (SEL1, SEL12, SEL2)= (H, H, H) holds;

the clock CLK21 is output when (SEL1, SEL12, SEL2)= (L, H, H) holds;

the clock CLK22 is output when (SEL1, SEL12, SEL2)= (L, L, H) holds; and the clock CLK3 is output when (SEL1, SEL12, SEL2)=(L, L, L) holds, as shown in FIG. 6.

The operation of the power supply circuit 3 having the structure set forth above will be described with reference to FIG. 7. It should be noted that in the operating state (from time t1 to t5), the operation of circuitry having the same structure as that of the power supply circuit 2 is similar to the operation of this circuitry in the power supply circuit 2; only operation of power supply circuit 3 that differs from that of power supply circuit 2 will be described.

The divided voltage Vd12 from the voltage-dividing point P12 of voltage dividing circuit 43 is output to the comparator circuit 44. The comparator circuit 44 compares the divided voltage Vd12 with the reference voltage Vref using the comparator COM12 and outputs the comparison result CPS12, which conforms to the value of the output voltage Vout (described later), as indicated at (gi) in FIG. 7. Owing to the hysteresis characteristic of the comparator COM12, the detection voltage V(COM12) detected by the comparator COM12 has a hysteresis width defined by an upper limit indicated by a dot line and a lower limit indicated by a dashed (broken) line, similar to the detection voltages V(COM1), V(COM2), as illustrated at (b) in FIG. 7. The detection voltage V(COM12) is detected at the upper limit indicated by the dot line when the output voltage Vout rises and at the lower limit indicated by the dashed (broken) line when the output voltage Vout falls.

The duty converting circuit 42 outputs the clocks CLK21, CLK22, as indicated at (el) in FIG. 7.

The clock CLK1 is input to the clock terminal CK of the D-type flip-flop FF12 in the selection signal generating circuit 45. In synch with the falling edge of the clock CLK, the D-type flip-flop FF12 reads in the logic at the data terminal D, i.e., the logic of the comparison result CPS12 that conforms to the value of the output voltage Vout, described later, and the logic at the output terminal Q becomes the read-in level. The logic at the output terminal Q is output as the selection signal SEL12, as indicated at (hj) in FIG. 7. It should be noted that the operation of the D-type flip-flop FF12 in response to the reset signal RESET is similar to that of the D-type flip-flops FF1, FF2.

The clocks CLK21, CLK22 from the duty converting (charging) circuit 42 are input to the selector 46. On the basis of the selection signals SEL1, SEL12, SEL2 conforming to the value of the output voltage Vout, described later, the selector 46 selects any of the clocks CLK21, CLK22, CLK3 or the "H"-level logic and outputs the selected signal as the PWM signal, as indicated at (k) in FIG. 7.

With regard to the operation through which the control signals S1, S4 conforming to the output voltage Vout are generated, this operation will be described for each of the load levels of the load circuit, namely the levels of the load current $I_O$. This will be described taking as an example a case where the load level transitions from a light load to an intermediate load and then to a heavy load, as indicated at (a) in FIG. 7.

(1) Light-load State: Load Current $I_O$ is Small (Time Period from t1 to t2)

In the time period from time t1 to time t2, the output voltage Vout is greater than the lower limit of the detection voltage V(COM2) of comparator COM2 (i.e., Vref≦Vd2), and the comparison results CPS1, CPS12, CSP2 are at the "L" logic level, as indicated at (g), (gi), (i) in FIG. 7. Accordingly, the selection signals SEL1, SEL12, SEL2 remain at the "L" level, as indicated at (h), (hj), (j) in FIG. 7. As a result, the clock CLK3 is selected as the PWM signal, as indicated at (k) in FIG. 7. The control signals S1, S4 thus become ON duty signals similar to those of the power supply circuit 2, as indicated at (l), (o) of FIG. 7.

(2) Light-intermediate-load State: Load Current $I_O$ is Small Intermediate (Time Period from t2 to t3)

When time t21 arrives, the output voltage Vout becomes greater than the lower limit of the detection voltage V(COM12) of comparator COM12 (i.e., Vref≦Vd12) and lower than the lower limit of the detection voltage V(COM2) of comparator COM2 (i.e., Vref>Vd2), as indicated at (b) of FIG. 7. At this time the comparison result CPS2 takes on the "H" logic level, as indicated at (i) of FIG. 7. The comparison results CPS1, CPS12 remain at the "L" level, as indicated at (g), (gi) of FIG. 7. In the time period from time t21 to time t3, the output voltage Vout is equal to or greater than the lower limit of the detection voltage V(COM12) of comparator COM12 (i.e., Vref≦Vd12) and is lower than the upper limit of the detection voltage V(COM2) of comparator COM2 (i.e., Vref>Vd2). At this time the comparison results CPS1, CPS2 remain at the "L" level, as indicated at (g), (gi) of FIG. 7. The comparison result CPS2 remains at the "H" level, as indicated at (i) of FIG. 7. Accordingly, the selection signal SEL2 attains the "H" logic level in synch with the falling edge of the clock CLK1 at time t22 and remains at the "H" level from time t22 to time t3, as indicated at (j) in FIG. 7. The selection signals SEL1, SEL12 remain at the "L" level from time t22 to time t3, as indicated at (h), (hj) in FIG. 7. As a result, the clock CLK22 is selected as the PWM signal from time t22 to time t3, as indicated at (k) in FIG. 7. The control signals S1, S4 thus become ON duty signals, as indicated at (l), (o) of FIG. 7.

(3) Heavy-intermediate-load State: Load Current $I_O$ is Large Intermediate (Time Period from t3 to t4)

When time t31 arrives, the output voltage Vout becomes equal to or greater than the lower limit of the detection voltage V(COM1) of comparator COM1 (i.e., Vref≦Vd1) and lower than the lower limit of the detection voltage V(COM12) of comparator COM12 (i.e., Vref>Vd12), as indicated at (b) of FIG. 7. At this time the comparison result CPS12 takes on the "H" logic level, as indicated at (gi) of FIG. 7. The comparison result CPS1 remains at the "L" level, as indicated at (g) of FIG. 7, and the comparison result CPS2 remains at the "H" level, as indicated at (i) of FIG. 7. In the time period from time t31 to time t4, the output voltage Vout is equal to or greater than the lower limit of the detection voltage V(COM1) of comparator COM1 (i.e., Vref≦Vd1) and is lower than the upper limit of the detection voltage V(COM12) of comparator COM12 (i.e., Vref>Vd12). At this time the comparison result CPS1 remains at the "L" level, as indicated at (g) of FIG. 7, and the comparison result CPS2 remains at the "H" level, as indicated at (i) of FIG. 7. Accordingly, the selection signal SEL12 attains the "H" logic level in synch with the falling edge of the clock CLK1 at time t32 and remains at the "H" level from time t32 to time t4, as indicated at (hj) in FIG. 7. The selection signal SEL1 remains at the "L" level from time t32 to time t4, as indicated at (h) in FIG. 7, and the selection signal SEL12 remains at the "H" level from time t32 to time t4, as indicated at (hj) in FIG. 7. As a result, the clock CLK22 is selected as the PWM signal from time t32 to time t4, as indicated at (k) in FIG. 7. The control signals S1, S4 thus become ON duty signals, as indicated at (l), (o) of FIG. 7.

(4) Heavy-load State: Load Current $I_O$ is Large (Time Period from t4 to t5)

When time t41 arrives, the output voltage Vout becomes lower than the lower limit of the detection voltage V(COM1) of comparator COM1 (i.e., Vref>Vd1). At this time the comparison result CPS1 takes on the "H" logic level, as indicated at (g) of FIG. 7. The comparison results CPS2, CPS12 remain at the "H" level, as indicated at (i), (gi) of FIG. 7. In the time period from times t41 to t5, the output voltage Vout is lower than the upper limit of the detection voltage V(COM1) of comparator COM1 (i.e., Vref>Vd1). At this time the comparison results CPS1, CPS12 remain at the "H" level, as indicated at (i), (gi) of FIG. 7. Accordingly, the selection signal SEL1 attains the "H" logic level in synch with the falling edge of the clock CLK1 at time t42 and remains at the "H" level from time t42 to time t5, as indicated at (h) in FIG. 7. The selection signals SEL2, SEL12 remain at the "H" level from time t42 to time t5, as indicated at (h), (hj) in FIG. 7. As a result, the "H" logic level is selected as the PWM signal from time t42 to time t5, as indicated at (k) in FIG. 7. This means that the clock CLK1 becomes the control signal S1, as indicated at (l) of FIG. 7. Further, the clock CLK1B becomes the control signal S4, as indicated at (o) of FIG. 7.

As described above, the power supply circuit 3 is adapted so as to carry out PWM control between the detection voltage of the comparator COM1 and the detection voltage of the comparator COM2 at two types of ON duty. As a result, in addition to the effects of the power supply circuit 2, the power supply circuit 3 also is capable of making ripple of the output voltage Vout lower than in the case of the power supply circuit 2.

It should be noted that although the present invention has been described taking as an example an arrangement in which a plurality of divided voltages of different voltage values are compared with a single reference voltage in the first and second exemplary embodiments, an arrangement in which a single divided voltage is compared with a plurality of reference voltages may be adopted. Further, in the second exemplary embodiment, the present invention has been described in an example in which PWM control between the detection voltage of the comparator COM1 and the detection voltage of the comparator COM2 is carried out at two types of ON duty. However, it may be so arranged that PWM control is carried out at three or more types of ON duty.

As many apparently widely different exemplary embodiments of the present invention can be made without departing from the spirit and scope thereof, it is to be understood that the invention is not limited to the specific exemplary embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A step-up power supply circuit comprising:
   a charge pump that connects a capacitor to a DC supply voltage by series-parallel switching, thereby boosting the DC supply voltage by a voltage to which the capacitor is charged; and
   a regulator that controls negative feedback of output voltage of said charge pump to a target voltage;
   wherein said regulator detects signals indicative of whether the output voltage of said charge pump is equal to or greater than each of a plurality of detection voltages or less than each of the plurality of detection voltages, and subjects the series-parallel switching to PWM control based upon a combination of the detected signals.

2. The circuit according to claim 1, said detected signals of said regulator is in the form of binary signal, and said combination of the detected signals is in the form of binary values.

3. The circuit according to claim 1, wherein detection of the output voltage of said charge pump is performed by comparing a divided voltage, which is obtained by voltage-dividing the output voltage, with a reference voltage; and the comparison of the divided voltage with the reference voltage is performed between a plurality of different voltages and a single voltage constituting the other of the compared values.

4. The circuit according to claim 3, wherein said regulator includes:

a frequency dividing circuit that generates a frequency-divided clock having a period that is twice that of a boost clock;

a voltage dividing circuit that generates the divided voltage;

a comparator circuit that compares the divided voltage and the reference voltage and outputs a plurality of comparison-result signals;

a selection signal generating circuit that reads in logic of each of the comparison-result signals in synch with an edge of the frequency-divided clock and outputs the binary signals as selection signals;

a duty converting circuit that outputs a plurality of clocks having the same period as that of the boost clock and ON duties that differ from the ON duty of the boost clock;

a selector that selects any one of the plurality of clocks or "H"-level logic as a PWM signal based upon the selection signals; and a gate circuit that takes the logical AND between the frequency-divided clock and the PWM signal and generating control signals for controlling the series-parallel switching.

5. The circuit according to claim 4, wherein a plurality of different divided voltages are generated by said voltage dividing circuit and are adopted as the plurality of different voltages; and said comparator circuit compares the plurality of different divided voltages with a single reference voltage.

6. A method for stepping-up voltage comprising:

providing a voltage step-up circuit including: a charge pump that connects a capacitor to a DC supply voltage by series-parallel switching, thereby boosting the DC supply voltage by a voltage to which the capacitor is charged; and a regulator that controls negative feedback of output voltage of said charge pump to a target voltage;

detecting, by said regulator, signals indicative of whether the output voltage of said charge pump is equal to or greater than each of a plurality of detection voltages or less than each of the plurality of detection voltages, and subjecting the series-parallel switching to PWM control based upon a combination of the detected signals.

7. The method according to claim 6, said detected signals of said regulator is in the form of binary signal, and said combination of the detected signals is in the form of binary values.

8. The method according to claim 6, wherein detection of the output voltage of said charge pump is performed by comparing a divided voltage, which is obtained by voltage-dividing the output voltage, with a reference voltage; and the comparison of the divided voltage with the reference voltage is performed between a plurality of different voltages and a single voltage constituting the other of the compared values.

9. The circuit according to claim 8, wherein said regulator performs:

frequency dividing to generate a frequency-divided clock having a period that is twice that of a boost clock;

voltage dividing to generate the divided voltage;

comparing the divided voltage and the reference voltage to output a plurality of comparison-result signals;

generating a selection signal circuit so as to read in logic of each of the comparison-result signals in synch with an edge of the frequency-divided clock to output the binary signals as selection signals;

converting duty to output a plurality of clocks having the same period as that of the boost clock and ON duties that differ from the ON duty of the boost clock;

selecting any one of the plurality of clocks or "H"-level logic as a PWM signal based upon the selection signals; and taking the logical AND between the frequency-divided clock and the PWM signal and generating control signals for controlling the series-parallel switching.

10. The method according to claim 9, wherein a plurality of different divided voltages are generated by said voltage dividing and are adopted as the plurality of different voltages; and said comparator circuit compares the plurality of different divided voltages with a single reference voltage.

* * * * *